United States Patent [19]

Heys et al.

[11] Patent Number: 4,551,675

[45] Date of Patent: Nov. 5, 1985

[54] APPARATUS FOR TESTING PRINTED CIRCUIT BOARDS

[75] Inventors: George Heys, Cambridge; Dennis R. Coon, Byesville, both of Ohio

[73] Assignee: NCR Corporation, Dayton, Ohio

[21] Appl. No.: 562,795

[22] Filed: Dec. 19, 1983

[51] Int. Cl.[4] ............................................. G01R 31/02
[52] U.S. Cl. ............................. 324/158 F; 324/73 PC
[58] Field of Search ........... 324/158 P, 158 F, 73 PC; 339/117 P

[56] References Cited

U.S. PATENT DOCUMENTS

| | | | |
|---|---|---|---|
| 3,654,585 | 4/1972 | Wickersham | 324/158 F X |
| 3,996,516 | 12/1976 | Luther | 324/158 P X |
| 4,209,745 | 6/1980 | Hines | 324/73 PC X |
| 4,229,693 | 10/1980 | Irick et al. | 324/158 F X |

FOREIGN PATENT DOCUMENTS

| | | | |
|---|---|---|---|
| 2920226 | 11/1980 | Fed. Rep. of Germany | 324/158 F |
| 2924262 | 2/1981 | Fed. Rep. of Germany | 324/158 P |
| 2038567 | 7/1980 | United Kingdom | 324/158 F |

Primary Examiner—Stewart J. Levy
Assistant Examiner—Stephen M. Baker
Attorney, Agent, or Firm—Wilbert Hawk, Jr.; Richard W. Lavin

[57] ABSTRACT

A fixture for testing plated-through holes of a printed circuit board includes a probe board having a plurality of first spring-actuated probe assemblies arranged in a matrix on a uniform rectangular grid, a converter board having a plurality of second spring-actuated probe assemblies arranged to engage the plated-through holes of the printed circuit board being tested, the converter board having copper tracks located on its lower surface connecting the second probe assemblies with the first probe assemblies and an elastic cover member positioned over the fixture to provide an air-tight seal when vacuum is applied to move the printed circuit board and the converter board in a direction to move the first and second probe assemblies into engagement with the copper tracks and the plated-through holes respectively enabling the plated-through holes to be tested for continuity.

4 Claims, 4 Drawing Figures

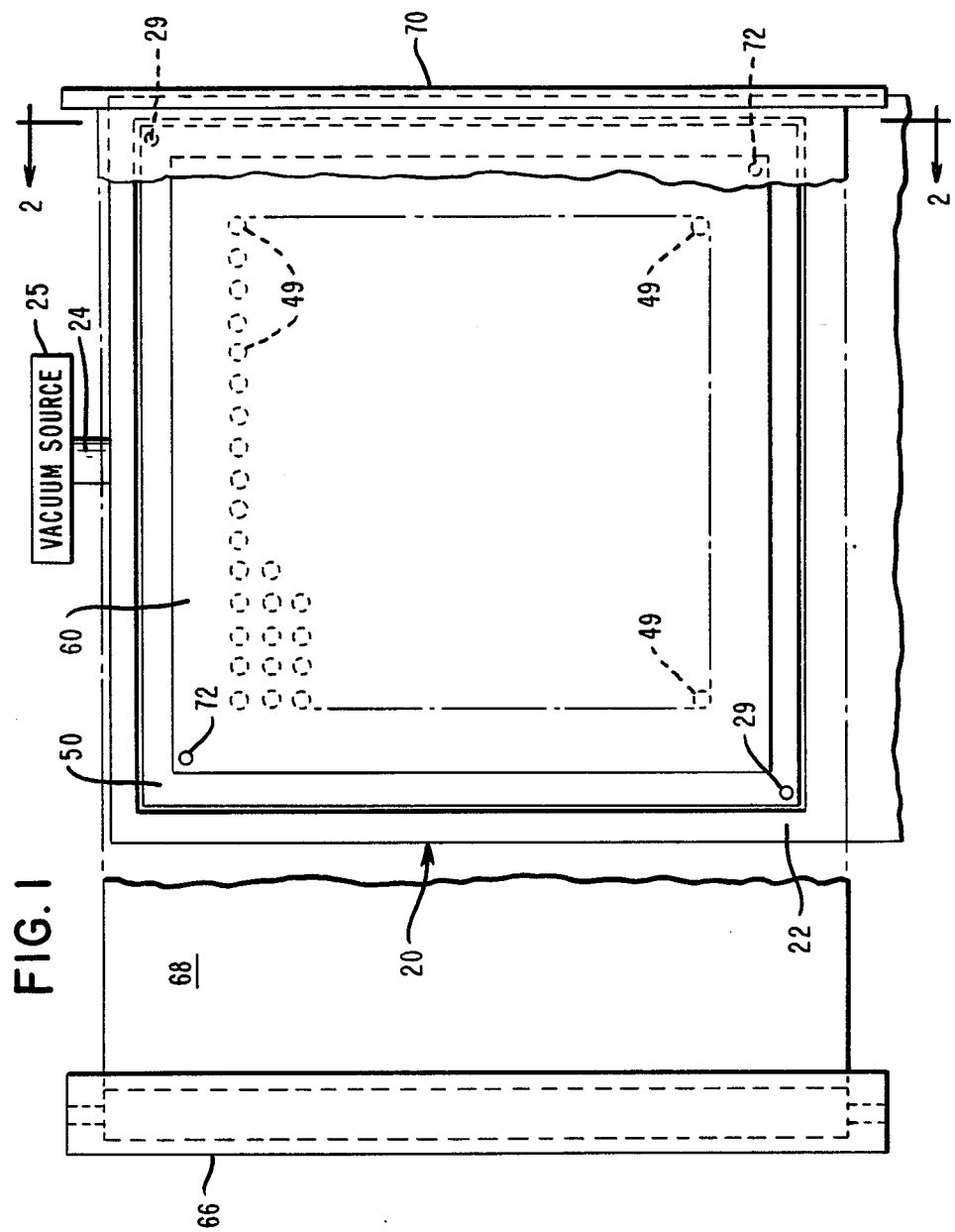

APPARATUS FOR TESTING PRINTED CIRCUIT BOARDS

BACKGROUND OF THE INVENTION

The present invention is directed to printed circuit boards and more particularly to an apparatus for testing printed circuit boards.

As the complexity of printed circuit boards increases, the equipment for testing the circuit boards becomes more complex. The usual arrangement for testing printed circuit boards is to position a probe board on top of the circuit board to be tested, in which probe board there is included a plurality of spring-biased probe members positioned to engage corresponding electrical locations in the printed circuit board. Movement of the probe board towards the circuit board provides the required contact between the probe members and the electrical locations. Each of the probe members carried by the probe board is wired to an interface member whereby a circuit is established between a control system located outside of the test equipment and electrical location on the circuit board upon contact between the probe members and the electrical locations. With the number of electrical locations on the circuit boards increasing, together with the corresponding increase of circuit boards having different configurations of electrical locations, the alignment of the probe members with the electrical locations becomes quite critical and requires costly complex test fixtures to accomplish such alignment.

To reduce such cost and simplify the structure of the test fixtures, test fixtures have been developed using a converter board which electrically connects probe members arranged in a uniform rectangular grid on a board member positioned adjacent the top surface of the converter board with randomly arranged contact points of a printed circuit board positioned against the lower surface of the converter board. An example of this arrangement is found in U.S. Pat. No. 3,654,585. However, it has been found that for large printed circuit boards or circuit boards having wired elements such as chokes, capacitors, etc. located on the surface, the above constructed converter board arrangement will not work. It is therefore a principal object of this invention to provide a test fixture overcoming the above-cited problems of the prior art.

It is another object of the present invention to provide a test fixture for testing a large number of different circuit board configurations which is low in cost.

SUMMARY OF THE INVENTION

These and other objects of the invention are fulfilled by providing a test fixture which includes a base member having a vacuum source. A probe board having a plurality of movable probe assemblies arranged in a grid-type configuration is mounted on the base member over which is mounted a converter board having a plurality of movable probe assemblies arranged in accordance with the location of the electrical contact points of the printed circuit board to be tested. The probe assemblies of the converter board extend a predetermined distance above the top surface of the converter board and engage a plated-through hole located in the printed circuit board to be tested. The probe members of the converter board are connected to a matrix pad located on the lower surface of the converter board by means of a copper track member which extends along the lower surface of the converter board in a direction to be engaged by one of the movable probe assemblies of the probe board. A polyethylene cover is positioned on top of the printed circuit board and the base member which, upon the application of a vacuum to the base member, seals the test fixture allowing the applied vacuum to move the printed circuit board and the converter board in a downward direction moving the probe assemblies of the converter board and the probe assemblies of the probe board into an engaging position with the platedthrough holes and the matrix pads respectively, enabling test signals to be generated for detecting the operating condition of the plated-through holes of the printed circuit board.

BRIEF DESCRIPTION OF THE DRAWINGS

The foregoing and various other objects, acknowledgments and meritorious features of the present invention will be apparent from the following detailed description and appended claims when read in conjunction with the drawings, wherein like numerals identify corresponding elements.

FIG. 1 is a top view of a test fixture of the present invention showing the location of the polyethylene cover and the grid location of the probe assemblies mounted in the probe board;

DESCRIPTION OF THE PREFERRED EMBODIMENT

Figure 3:
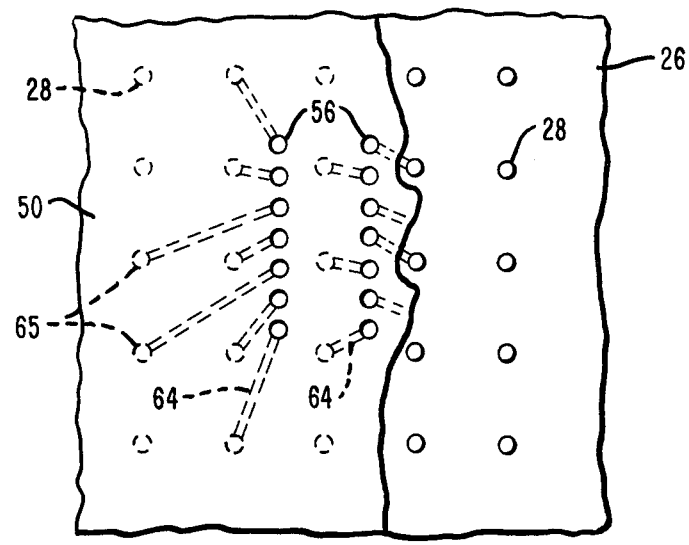
FIG. 3 is an enlarged fragmentary view of the top surface of the converter board with a portion removed showing the location of the matrix pads and their copper connections to the probe assemblies of the converter board with the probe assemblies of the probe board.

Referring now to FIG. 1, there is disclosed a top view of the test fixture of the present invention which includes a rectangular-shaped base member generally indicated by the numeral 20 including a rail portion 22 extending around the circumference of the base member 20. Included in the base member is a conduit extension 24 which is secured to a source of vacuum 25 for applying a vacuum to the interior of the base member 20. Positioned within the base member 20 is a probe board member 26 (FIG. 2) which includes a plurality of slidably mounted probe assemblies generally indicated by the numeral 28 (FIG. 4), each of which includes a copper stem member 30 having a sensing head portion 32. The stem member 30 is slidably positioned within a copper sleeve member 34 mounted within the probe board member 26 by any conventional means such as soldering. Positioned within the sleeve member 34 is a compression spring member 36, the upper end of which engages a ball member 38 bearing against the cam surface 40 of a lower end portion 42 of the stem member 30. Positioned at the lower end of the sleeve member 34 is a spring retainer member 44 engaging the lower end of the spring member 36. Extending from the lower end of the retainer member 44 is an extension portion 46 to which is attached a wire (not shown) connected to a contact panel 48 (FIG. 2) secured to the lower surface of the base member 20. As will be described more fully hereinafter, test signals transmitted through the contact panel 48 are outputted to a control unit (not shown) for processing as part of the circuit board test procedure. The probe assemblies 28 are mounted on the probe board 26 in a grid pattern 49 as shown in FIG. 1.

Figure 4:
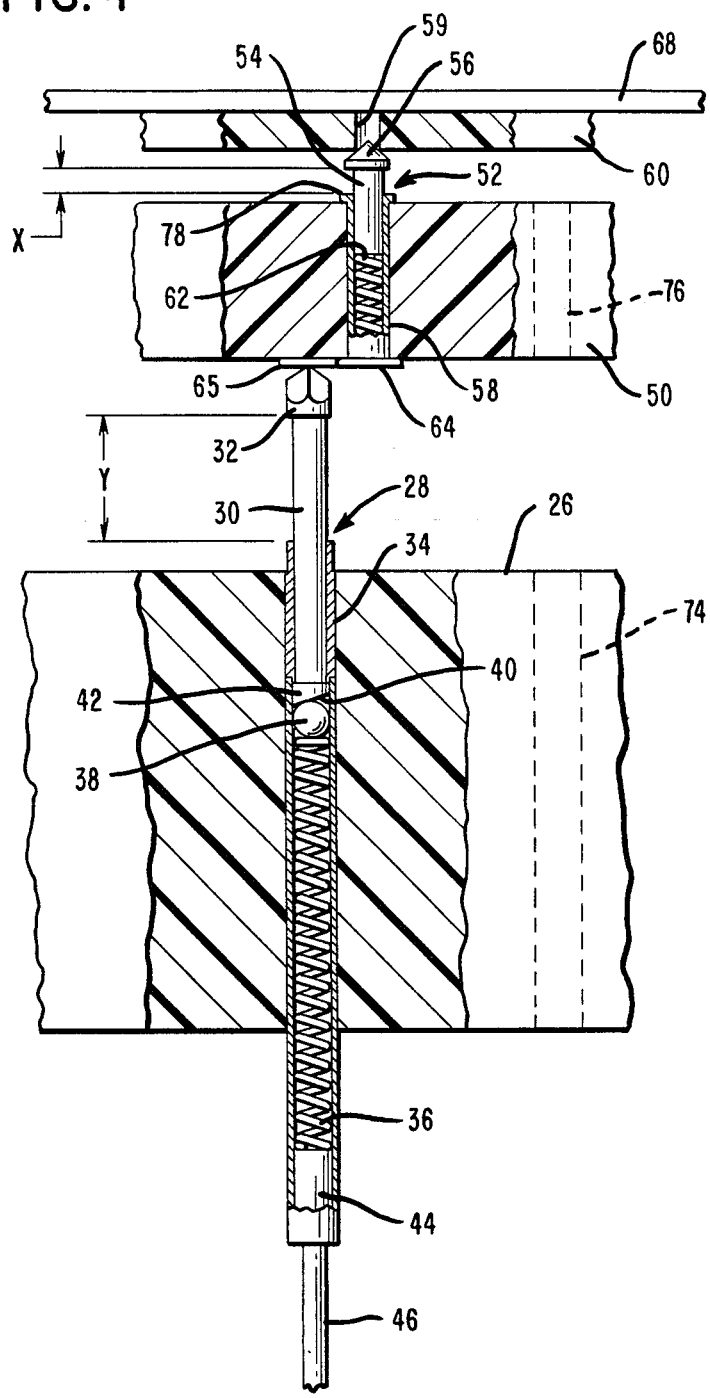
FIG. 4 is a partial sectional view of the test fixture showing detailed construction of the converter board and the probe board together with their probe assemblies.

Slidably mounted on diagonal guide pins 29 (FIG. 1) secured to the probe board member 26 and engaging the stem members 30 of the probe assemblies 28 is a converter board 50 (FIGS. 2, 3 and 4) which includes a plurality of slidably mounted probe assemblies generally indicated by the numeral 52 and which includes a copper probe stem member 54 having a diamond-shaped sensing head portion 56 (FIG. 4). The stem member 54 is slidably mounted within a copper sleeve member 58 mounted within the converter board 50 by any conventional means such as soldering. Each of the probe assemblies 52 is positioned in the converter board 50 to correspond to the location of a platedthrough hole 59 in the printed circuit board 60 (FIGS. 1, 2 and 4) being tested. The probe board 26, the converter board 50 and the base member 20 are composed of a fiberglass-epoxy compound commercially available by the designation G-10 from the Dow-Corning Corporation of Corning, N.Y.

A compression spring 62 mounted in the sleeve member 58 of the probe assemblies 52 normally urges the stem member 54 in an upward direction. Soldered to the lower surface of the converter board 50 and the end of each sleeve 58 is a copper track 64 (FIGS. 3 and 4) which extends from a position engaging the lower end of the sleeve member 58 to a location where it terminates in a matrix pad 65 located at a position where it will be engaged by one of the probe assemblies 28 of the probe board 26. As best understood from FIG. 3, each of the probe assemblies 52 in the converter board 50 is connected by means of the copper matrix pad 65 and the copper track 64 to the closest location of a probe assembly 28 of the probe board 26. It is obvious from this construction that each circuit board 60 to be tested is required to have a converter board 50 whose probe assemblies 52 are positioned to make contact with the plated-through holes 59 of the circuit board. It is further obvious that such an arrangement requires only one probe board 26, which reduces significantly the cost of the test fixture.

Figure 2:
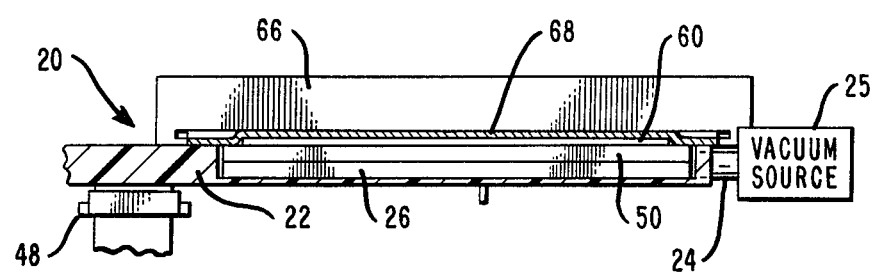
FIG. 2 is a sectional view of the test fixture taken along line 2—2 of FIG. 1 showing the location of the printed circuit board being tested and the engagement of the polyethylene cover with the base member.

As best seen in FIG. 1, adjacent one side of the base member 20 is a roll 66 of a polyethylene cover 68 which is unwound against the action of a spring drive (not shown) and then stretched over the test fixture by use of an end rod 70. This cover operation occurs after positioning the probe board 26 and the converter board 50 within the base member 20 and mounting the circuit board 60 that is to be tested on the converter board 50 by sliding same over diagonal locating pins 72 (FIG. 1) secured to the converter board. The cover 68 is then stretched and positioned over the top of the test fixture as shown in FIG. 2. Vacuum is then applied to the test fixture through the conduit 24 (FIGS. 1 and 2) from the source 25 creating a differential atmospheric pressure in that the local atmosphere within the test fixture covered by the cover 68 is at a lower pressure than the ambient atmosphere outside the fixture. The vacuum is applied through a hole 74 (FIG. 4) which extends through the probe board 26 and through a similar hole 76 located in the converter board 50 to allow the differential atmospheric pressure to move the printed circuit board 60 and the converter board 50 in a downward direction. This movement of the printed circuit board 60 moves each probe stem 54 and its head portion 56 into engagement with a plated-through hole 59 located in the printed circuit board.

The downward movement of the printed circuit board 60 is limited by the engagement of the head portion 56 of the stem member 54 with a shoulder portion 78 of the sleeve 58. The length of movement of the head portion 56, which is indicated by (X) in FIG. 4, provides a clearance between the printed circuit board 60 and the converter board 50 allowing for the testing of printed circuit boards having electrical components extending above the surface of the printed circuit board. It is obvious that by increasing the thickness of the sleeve shoulder portion 78, the clearance between the circuit board 60 and the converter board 50 can also be increased.

The vacuum applied to the test fixture through the conduit 24 initially moves the cover 68 against the upper surface of the circuit board 60 and the top of the rail portion 22 (FIGS. 1 and 2) of the base member 20, providing a seal around the fixture enabling the applied vacuum to move the circuit board 60 and the converter board 50 in a downward direction. This results in downward movement of the probe assemblies 28 against the action of the springs 36, through a distance indicated by (Y) in FIG. 4, whereby the head portion 32 of each probe assembly 28 is positioned against an associated matrix pad 65. It will thus be seen from this construction that providing an elastic cover 68 over the test fixture enables a vacuum to be applied to the circuit board 60 and the converter board 50 for moving such boards in a direction to ensure positive contact between the plated-through holes 59 of the printed circuit board 60 and the probe assemblies 52 and 28 of the converter board 50 and the probe board 26, respectively. This contact establishes an electrical circuit by which testing of the plated-through holes can be accomplished. Electrical signals supplied through the contact plate 48 (FIG. 2) from a control unit (not shown) allow the continuity of the circuit board holes 59 to be tested.

Numerous modifications and adaptations of the system of the present invention will be apparent to those skilled in the art, and thus it is intended by the appended claims to cover all such modifications and adaptations which fall within the true spirit and scope of this invention.

We claim:

1. An apparatus for making temporary electrical connections to a plurality of electrical contact points on a surface of a printed circuit board or the like having said contact points arranged in an irregular pattern peculiar to a particular type of such board or the like in which the surface of the printed circuit board includes circuit elements extending a predetermined distance above the surface of said board, said apparatus comprising:
   a housing member of insulating material having a continuous sidewall portion;
   a first planar board member of insulating material having a plurality of first probe assemblies and mounted within the housing member, said probe assemblies arranged in a fixed matrix pattern different from said irregular pattern of the contact points in the printed circuit board and each including a first sleeve member mounted in said first planar board member, a first stem member slidably positioned within the sleeve member and a first spring member mounted within said sleeve member and engaging said stem member for normally urging said stem member in a sensing direction;

a second planar board member of insulating material slidably mounted on said first board member and engaging said first stem members in a supporting relationship, said second board member including a plurality of second probe assemblies arranged in a pattern corresponding to the irregular pattern of the printed circuit board and in which each of said second probe assemblies includes a second sleeve member mounted in said second planar board member, a second stem member having a sensing head portion slidably positioned within said sleeve member and a second spring member located within said second sleeve member for normally urging said second stem member in a sensing direction;

means secured to said second planar board member for electrically connecting said first and second stem members upon mounting of said second planar board member on said first planar board member;

means for slidably mounting a printed circuit board on said second planar board member wherein each of said second stem members engages an electrical contact point on the printed circuit board;

said second sleeve member including a shoulder portion formed on said second sleeve member and extending a predetermined distance away from said second planar board member and towards said printed circuit board for limiting the movement of said second stem member, said shoulder portion engaging the head portion of said second stem member upon movement of the second planar board member towards said printed circuit board, thereby preventing the second planar board member from engaging the circuit elements mounted on the printed circuit board;

a spring actuated supply roll of flexible cover material located adjacent said printed circuit board enabling the cover material to be removed from the roll and positioned over said printed circuit board and said housing member; and means connected to said housing member for applying a vacuum to the housing member whereby the cover material is moved into engagement with the sidewall portion of the housing member sealing the interior of the housing member enabling the applied vacuum to move the cover material, the printed circuit board and the second planar board member in a direction to move said first stem members into contact with said electrical connection means and said second stem members into contact with the contact points of the printed circuit board, thereby establishing electrical contact between the contact points of the printed circuit board and the first stem members.

2. The fixture of claim 1 in which the contact points of the printed circuit board comprise plated-through apertures and the sensing head portion of said second stem members has a tapered portion capable of penetrating one of said plated-through apertures in the printed circuit board and a base portion whose diameter is greater than the diameter of the aperture and the diameter of the stem member, said base portion engaging said shoulder portion of the second sleeve member to limit the movement of the printed circuit board to a position spaced from the second planar board member whereby the circuit elements extending from the surface of the printed circuit will not engage said second planar board member.

3. The fixture of claim 2 in which said first and second planar board members include apertures extending through the board members in a sensing direction through which the vacuum applied to the interior of the housing member is applied to said flexible cover material, the printed circuit board and the second planar board member enabling both the printed circuit board and the second planar board member to move towards the first planar board member whereby the first and second stem members are moved in a sensing direction.

4. A method for testing the electrical continuity of a plurality of plated-through holes arranged in an irregular pattern on a surface of the printed circuit board having a plurality of circuit elements protruding from the surface of the printed circuit board comprising the steps of:

mounting a first planar board member within a housing member, the board member including a plurality of first movable sensing members extending in a vertical direction above the board member and arranged in a fixed matrix pattern;

slidably mounting a second planar board member vertically on said first planar board member and engaging the first movable sensing members, the second planar board member including a plurality of second movable sensing members which limit the movement of the second sensing members a predetermined distance in a sensing direction, the second sensing members extending in a vertical direction above the board and arranged in a pattern corresponding to the irregular pattern of the holes through the printed circuit board, the second board member further including electrical connecting means for interconnecting the first and second movable sensing members upon mounting the second planar board member on said first planar board member;

slidably mounting a printed circuit board vertically on the second planar board member wherein the circuit elements face the second planar board member and each plated-through hole in the printed circuit board is engaged by one of said second movable sensing members;

locating a supply of flexible material adjacent the housing member;

removing a portion of the flexible material from the supply for covering the printed circuit board and the housing member;

applying a vacuum to the interior of the housing to move the cover material, the printed circuit board and the second planar board member in a direction towards the first planar board member wherein the printed circuit board is moved against said second sensing members through said predetermined distance which positions said second planar board member adjacent the circuit elements of the printed circuit board; and applying electrical test signals to the first movable sensing member for transmission to the plated through holes of the printed circuit board.

* * * * *